US009869720B2

(12) United States Patent
Orman et al.

(10) Patent No.: US 9,869,720 B2
(45) Date of Patent: Jan. 16, 2018

(54) METHOD OF DETERMINING STATIONARY SIGNALS FOR THE DIAGNOSTICS OF AN ELECTROMECHANICAL SYSTEM

(71) Applicant: ABB TECHNOLOGY AG, Zurich (CH)

(72) Inventors: Maciej Orman, Radziszow (PL); James Ottewill, Middlesex (GB); Michal Orkisz, Cracow (PL)

(73) Assignee: ABB TECHNOLOGY AG, Zurich (CH)

( * ) Notice: Subject to any disclaimer, the term of this patent is extended or adjusted under 35 U.S.C. 154(b) by 825 days.

(21) Appl. No.: 14/348,083

(22) PCT Filed: Sep. 19, 2012

(86) PCT No.: PCT/EP2012/003915
§ 371 (c)(1),
(2) Date: Mar. 28, 2014

(87) PCT Pub. No.: WO2013/045045
PCT Pub. Date: Apr. 4, 2013

(65) Prior Publication Data
US 2014/0236537 A1  Aug. 21, 2014

(30) Foreign Application Priority Data
Sep. 30, 2011  (EP) .................................. 11460050

(51) Int. Cl.
*G01R 31/34* (2006.01)
(52) U.S. Cl.
CPC ........... *G01R 31/34* (2013.01); *G01R 31/343* (2013.01)

(58) Field of Classification Search
CPC .............................. G01R 31/34; G01R 31/343
(Continued)

(56) References Cited
U.S. PATENT DOCUMENTS

| 5,461,329 | A | 10/1995 | Linehan et al. ........ G01R 31/34 |
| 6,026,348 | A * | 2/2000 | Hala .................... G01H 1/003 |
| | | | 702/126 |

(Continued)

OTHER PUBLICATIONS

Potamianos et al., An Open-Circuit Faults Diagnosis Method for Matrix Converters Based on DWT Analysis of Output Current, Aug. 30-Sep. 1, 2011, Proceedings of the 2011—14th European Conference on Power Electronics and Applications (EPE 2011), 10 pp.*

(Continued)

*Primary Examiner* — Toan Le
(74) *Attorney, Agent, or Firm* — Renner Kenner Greive Bobak Taylor & Weber

(57) ABSTRACT

The present invention is concerned with a method of determining stationary signals for the diagnostics of an electromechanical systems in which electrical rotating machinery is used and in which at least one electrical or mechanical signal is measured during an operation of the electromechanical system. The method is used especially for condition monitoring of electric motors and generators. The method consists of
  measuring an analog waveform signal (S) of the electromechanical system
  and then manipulating that signal in various ways to obtain a frequencies spectrum, from which a vector of interest frequencies and corresponding vector of amplitudes are extracted to diagnose the electromechanical system.

6 Claims, 5 Drawing Sheets

(58) Field of Classification Search
USPC .......................................................... 702/183
See application file for complete search history.

(56) References Cited

U.S. PATENT DOCUMENTS 6,321,602 B1 * 11/2001 Ben-Romdhane ...... F16C 19/52
340/679
9,459,088 B2 * 10/2016 Ottewill ............... G01R 31/343

OTHER PUBLICATIONS

Abstract of Potamianos et al., Aug. 30-Sep. 1, 2011, 1 pp.*
European Search Report dated Feb. 24, 2012 in corresponding application No. EP 11460050.
European Opinion dated Mar. 13, 2012 in corresponding application No. EP 11460050.5.
International Search Report dated Oct. 29, 2012 in corresponding application No. PCT/EP2012/003915.
Written Opinion dated Oct. 29, 2012 in corresponding application No. PCT/EP2012/003915.

* cited by examiner

METHOD OF DETERMINING STATIONARY SIGNALS FOR THE DIAGNOSTICS OF AN ELECTROMECHANICAL SYSTEM

CROSS-REFERENCE TO RELATED APPLICATION

This is a §371 application of International patent application number PCT/EP2012/003915 filed Sep. 19, 2012, which claims the benefit of European patent application No. 11460050.5 filed on Sep. 30, 2011, and which are incorporated herein by reference.

The present invention is concerned with a method of determining stationary signals for the diagnostics of an electromechanical systems in which electrical rotating machinery is used and in which at least one electrical or mechanical signal is measured during an operation of the electromechanical system. The method is used especially for condition monitoring of electric motors and generators.

BACKGROUND OF THE INVENTION

Described state of the art presents solutions based on measurements of currents signals, although similar issues could be applied to other physical signals, for example voltage or acceleration in vibration measurements.

Electric motors and electric generators, or, more generally, electric rotating machines form key parts of electromechanical systems. The analysis of currents which may be measured from the power cables connecting the electrical rotating machines to the power source has been shown as a successful method for monitoring the condition of electromechanical systems. It has been shown that the currents that are induced in an electrical rotating machine change with operating conditions, often resulting in amplitude and phase modulations of large alternating current power supply currents.

Under steady operating conditions many defects cause modulations of currents which may be measured from power supply cables. These modulations are typically analyzed in the frequency domain as an increase in amplitude components at a particular band of frequencies. The analysis of the amplitude components at particular frequencies of the frequency spectrum of current signals measured from the power cables of electrical rotating machines is known as motor current signature analysis MCSA. In recent years MCSA has become a standard method of detecting and trending the development of motor faults. Typically, in the case that the electrical rotating machine under consideration is supplied direct on-line, the electrical supply frequency does not vary substantially over a measurement period. As a result, MCSA is easily applied in the analysis of an electrical rotating machine which is supplied direct on-line as modulations of the electrical supply frequency are consistent throughout the measurement period and are thus easily distinguished from noise. Using the method it is possible to determine the motor state and predict a failure such as eccentricity, rotor bar failure, bearing failure etc. or schedule a maintenance action.

Increasingly, electrical rotating machines are supplied by variable-speed-drives. In this situation the electrical supply frequency is rarely a constant value, typically varying in accordance with torque and flux demands. The non-stationary nature of a current signal recorded from a variable-speed-drive supplied motor results in a decrease in effectiveness of MCSA as peaks of interest cease to occur at single, distinct frequencies and may be difficult to distinguish from noise signals. Furthermore, there is an increased likelihood that peaks of interest may be polluted by harmonics of the electrical supply frequency.

Patent description U.S. Pat. No. 5,461,329, describes a method for analyzing non-stationary motor current signals by incorporating circuitry in the data acquisition system which changes the sampling rate of measured current signals in line with the changing frequency of the AC power supply current carrier wave. An adjustable frequency clock generator, which in its preferred form incorporates a Phase Locked Loop PLL, accepts a motor current signal as its input and outputs a clock signal which is utilized by an analogue to digital converter sampling a motor current signal. The sampled data is then transformed to the frequency domain using the Discrete Fourier Transform and signals of interest are analyzed. There are some limitations to methods based upon sampling signals using an adjustable frequency clock, and in particular a PLL. Fundamentally, PLLs use an internal filter which is tuned to the expected frequency of interest, which is assumed to be around the nominal supply frequency of the electric motor. Whilst this is generally true in the case of electric motors supplied direct on-line, in the case of a variable-speed-drive supplied electric motor, the supply frequency can vary greatly. The circuitry required to create an adjustable frequency clock which can handle wide frequency variations is much more complex than the equivalent circuitry of a system where the frequency of interest is well-defined and does not vary considerably. Furthermore, there is an inevitable lag between the measured current signal and the frequency estimate by the adjustable frequency clock. As a result there is a delay between a change in the supply frequency of the motor current signal and the associated change in the sampling frequency of the analogue to digital converter. In addition, circuitry used for adjusting the sampling rate of the motor current signal is susceptible to noise, which can lead to a loss of coherency between sampled signals due to incorrect frequency estimation. With reference to Motor Current Signature Analysis, this can lead to false diagnosis of problems.

SUMMARY OF THE INVENTION

The essence of the inventive method of determining stationary signals for the diagnostics of an electromechanical systems is that it includes the following steps.

Measuring an analog waveform signal S of the electromechanical system.

Converting measured waveform signal S to discrete processed signal $S_{DP}$ including vector of time instants and corresponding vector of amplitudes.

Splitting the discrete processed signal $S_{DP}$ into subdivided single periods $S_{DP1}, S_{DP2}, \ldots, S_{DPn}$ where each of the subdivided single periods includes different or the same number of samples as other subdivided single periods.

Modifying number of samples for each subdivided single periods $S_{DP1}, S_{DP2}, \ldots, S_{DPn}$ by resampling procedure getting subdivided single periods after resampling $S_{DR1}, S_{DR2}, \ldots, S_{DRn}$, where all said subdivided single periods after resampling include the same number of samples.

Replacing the vector of time instants on a vector of consecutive integer numbers for each single period after resampling $S_{DR1}, S_{DR2}, \ldots, S_{DRn}$, obtaining subdivided nondimensional single periods $S_{DN1}, S_{DN2}, \ldots, S_{DNn}$.

Concatenating all subdivided nondimensional single periods $S_{DN1}, S_{DN2}, \ldots, S_{DNn}$ into one nondimensional discrete signal $S_N$ by forming a sequence of consecutive samples setting up one after another taken from consecutive subdivided nondimensional single periods.

Replacing the vector of consecutive integer numbers on a vector of ascending time instants in the nondimensional discrete signal ($S_N$), obtaining a dimensionalized stationary signal ($S_{Nt}$), Transforming the dimensionalized stationary signal ($S_{Nt}$) from time domain to frequency domain, getting a frequencies spectrum, from which a vector of interest frequencies and corresponding vector of amplitudes are extracted to diagnose the electromechanical system and displayed on the visualization device.

Preferably the measured analog signal is a current signal. Preferably the method to diagnose the electromechanical system is a Motor Current Signature Analysis. Alternatively the measured analog signal is a voltage signal. Alternatively the measured analog signal is a torque signal. Alternatively the measured analog signal is an acceleration or a velocity or a movement of vibration.

The main advantage of the inventive method is that it allows many of the techniques of analyzing the electric signals of electrical rotating machines, which are well known in the state of the art, to be applicable in cases where the electrical rotating machine is supplied by a variable-speed-drive. Furthermore, unlike existing methods, the inventive method is unaffected by large variations in the electrical supply frequency and requires no a priori knowledge of the frequency content of the electrical signals.

BRIEF DESCRIPTION OF THE DRAWINGS

The subject of the invention is presented as an embodiment in the following drawings.

DETAILED DESCRIPTION OF THE INVENTION

Figure 1:
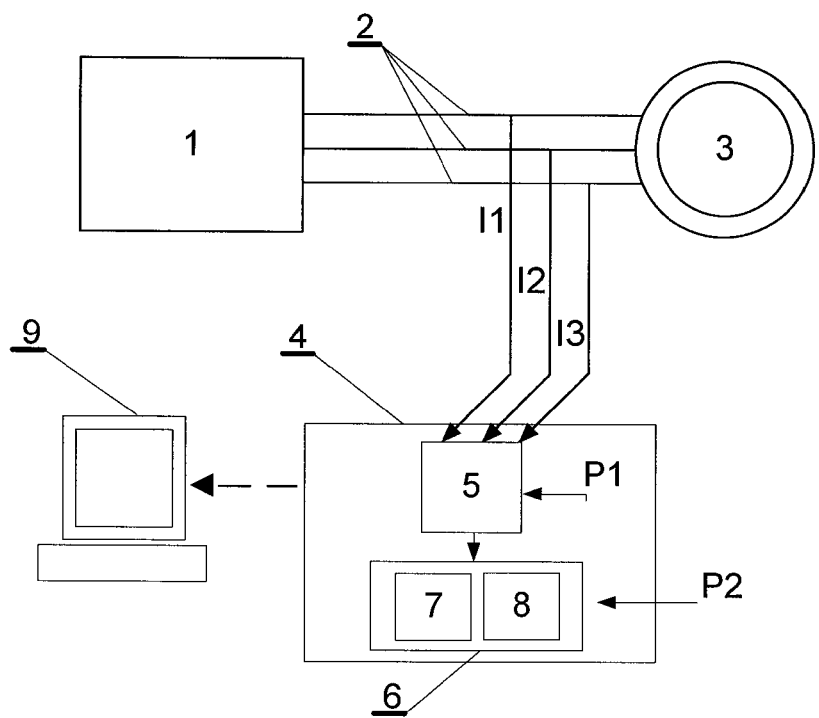
FIG. 1 shows a block diagram of the system for the realization of the invention.

The measuring system for the realization of the method according to the invention, shown on FIG. 1, is connected to a three-phase source of alternating current supply 1 connected with an electric motor 3 by supply cables 2. In the presented embodiment of the invention, the source of alternating current supply 1 is three-phase, however, although it is not presented in the drawing, it will be understood by those skilled in the state of the art that the described invention may also be applied to electrical rotating machines supplied with one phase as well as multiphase.

The supply cables 2 are connected with a measuring device 4 containing an analog to digital converter 5 which is connected with a computer processing device 6 equipped with standard elements such as processor, memory and data storage module not shown on the drawing. It is also equipped with processing module 7 and a nondimensionalisation module 8 which are suitable for the realization of the method according to the invention. The computer processing device 6, through the measuring device 4, is coupled with a device 9 for visualizing the results obtained by executing the inventive method. In the presented embodiment of the invention, the measuring device 4 is integrated with the computer device 6, but the measuring device and the computer device may be separate devices, which is not shown in the drawing. In such case the device 9 for visualizing the results is directly or remotely connected with the computer device 6.

In the presented embodiment of the invention, the analog current signals I1, I2, I3 of the alternating current that supplies the stator winding are measured, however, any electrical or mechanical analog waveform signals of the electromechanical system can be recorded. For example it might be the following signals: voltage, torque or signals related to vibration measurements like shift, movement or acceleration. The described method can be used for any number of signals independently, therefore the description includes only the processing of one analog waveform signal, denoted as S. The method according to the invention is executed in the following steps 1-5.

Step 1

Figure 2:
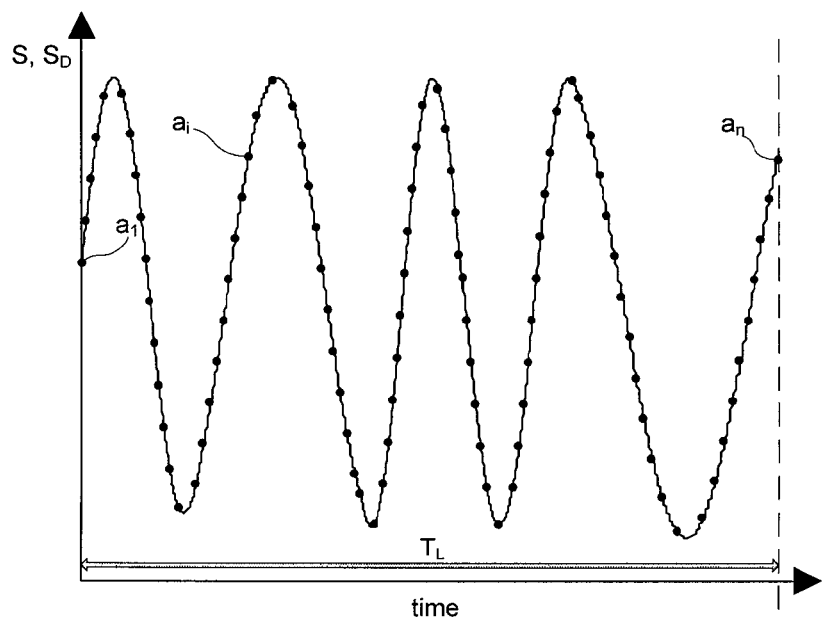
FIG. 2 shows a diagram of recorded analog signal S and its discrete version $S_D$.

In step 1 the measured analog waveform signal S is measured and then converted to discrete signal $S_D$ in an analog to digital converter 5 to which constant parameters P1 are supplied. FIG. 2 shows both signals: analog signal S—solid line and discrete current signal $S_D$—circle markers. Parameters P1 characterize the process of conversion of analog signals to discrete signals, being comprised of the sampling rate $F_S$ given by user and the length of the signal subject to conversion $T_L$ given by user. The sampling rate $F_S$ defines the number of samples per second taken from the analog waveform signal S. Usually the minimum sampling rate is 1 kHz and this is the default setting.

Signal length $T_L$ defines the length of the analog waveform signal S taken for analog to digital conversion. In the embodiment of the inventive method the minimum value of the signal length $T_L$ is 1 s.

Discrete signal $S_D$ is automatically transmitted to the processing module 7 implemented in the computer device 6.

Step 2

The discrete signal $S_D$ consists of samples $\{a_1, \ldots a_i, \ldots a_k\}$. Each sample is described by two coordinates: time instant, means time when sample was recorded, and corresponding amplitude recorded from analog waveform signal S. Series of all time instants create vector of time instants. Series of all corresponding amplitudes create corresponding vector of amplitudes.

In step 2, first an arithmetic mean value $X_{mean}$ of the discrete signal $S_D$ of the length $T_L$ is calculated as follows:

$$X_{mean} = \frac{a_1 + a_2 + \ldots a_i \ldots + a_k}{k} \quad (1)$$

where $a_i$ is the value of sample i and k is the total number of samples in the discrete signal $S_D$. The number of samples k is equal to the sampling frequency $F_S$ multiplied by the signal length $T_L$.

Next, the discrete processed signal $S_{DP}$ that consists of 5 samples denoted as $\{b_1, \ldots b_i \ldots b_k\}$ is calculated by subtracting mean value $X_{mean}$ from the value $a_i$ of every sample point of the discrete signal $S_D$:

$$\{b_i\} = \{a_i\} - X_{mean} \quad (2)$$

As a result of the above operation, in comparison to signal $S_D$, the discrete processed signal $S_{DP}$ has the same vector of time instants and modified vector of corresponding amplitudes.

Figure 3:
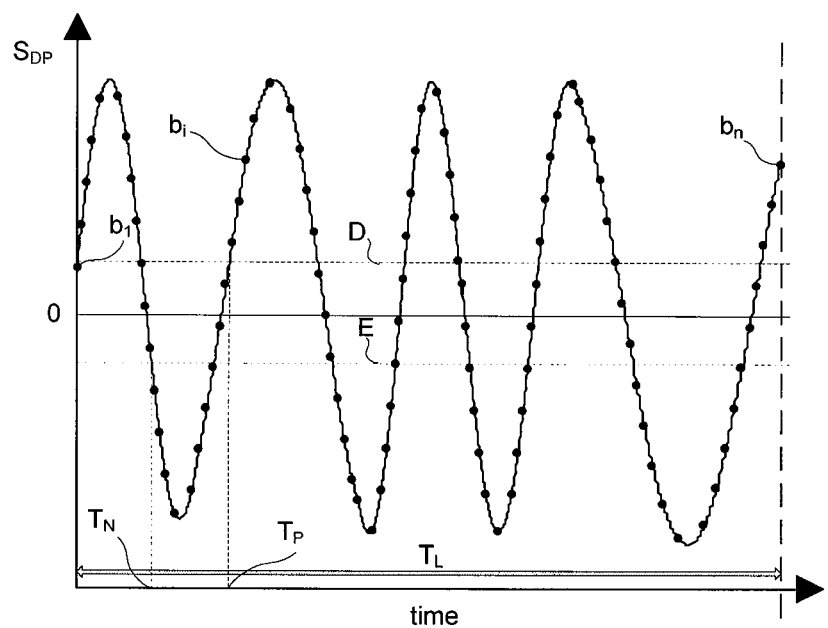
FIG. 3 shows a diagram of modified discrete processed signal $S_{DP}$ that was obtained from discrete signal $S_D$.

The above modifications of discrete signal $S_D$ are needed for next calculations of zero crossings. FIG. 3 shows the values of samples $\{b_1, \ldots b_i, \ldots b_k\}$ of discrete processed signal $S_{DP}$ in the time domain and indicates the various characteristics of the discrete processed signal $S_{DP}$ which are identified during the process of determining the instantaneous power supply frequency of the discrete processed signal $S_{DP}$. Zero crossings are identified by detecting a change in the sign of the discrete processed signal $S_{DP}$. Positive zero crossings are defined as zero crossings which occur when the sign of the discrete processed signal $S_{DP}$ changes from negative to positive whilst negative zero crossings are defined as zero crossings which occur when the sign of the discrete processed signal $S_{DP}$ changes from positive to negative.

Signals collected from supply cables always contain a level of noise. In order to ensure that the zero crossings which are detected are owing to a change in sign of the underlying power supply signal and not due to recorded noise, a positive hysteresis parameter D is supplied as P2. Preferably the value of positive hysteresis parameter D given by user should be equal to 10% of nominal motor current. When the discrete processed signal $S_{DP}$ changes its value from negative to positive and when its value is bigger than the value of positive hysteresis parameter D, a positive zero crossing time instant $T_P$ is detected. When the discrete processed signal $S_{DP}$ changes its value from positive to negative and when its value is smaller than the negative hysteresis parameter E given by user, established as the negative value of the positive hysteresis parameter D supplied as P2 for positive hysteresis (E=-D), a negative zero crossing time instant $T_N$ is detected. Sequences of consecutive positive zero crossing time instants $T_{P1}, T_{P2}, \ldots T_{Pn}$ and sequences of consecutive negative zero crossing time instants $T_{N1}, T_{N2}, \ldots T_{Nn}$ are the result of this step.

All transformations described in the step 2 are realized in the processing module 7.

Step 3

In step 3, first the sequence of time intervals $T_{D1}, T_{D2}, \ldots, T_{Dn}$ between each consecutive positive zero crossing time instants $T_{P1}, T_{P2}, \ldots T_{Pn}$ and consecutive negative zero crossing time instants $T_{N1}, T_{N2}, \ldots T_{Nn}$ is calculated according to the following equation:

$$T_{D1} = |T_{P1} - T_{N1}|, T_{D2} = |T_{P2} - T_{N2}|, \ldots, T_{Dn} = |T_{Pn} - T_{Nn}| \quad (3)$$

Next, the arithmetic mean value of the sequence of time intervals $T_{D1}, T_{D2}, \ldots, T_{Dn}$ is calculated according to the equation:

$$T_{mean} = (T_{D1} + T_{D2} + \ldots + T_{Dn})/n \quad (4)$$

where n means total number of positive or negative zero crossings.

Then a base supply frequency $F_l$ is calculated by inversion of the arithmetic mean value of the sequence of time intervals $T_{mean}$ multiplied by a factor of two.

$$F_l = \frac{1}{2T_{mean}} \quad (5)$$

Next the number of samples per one period $N_{Fs}$ of a signal with constant frequency equal to the base supply frequency $F_l$ is calculated by dividing sampling rate $F_S$ by base supply frequency $F_l$.

$$N_{Fs} = \frac{F_S}{F_l} \quad (6)$$

Figure 4:
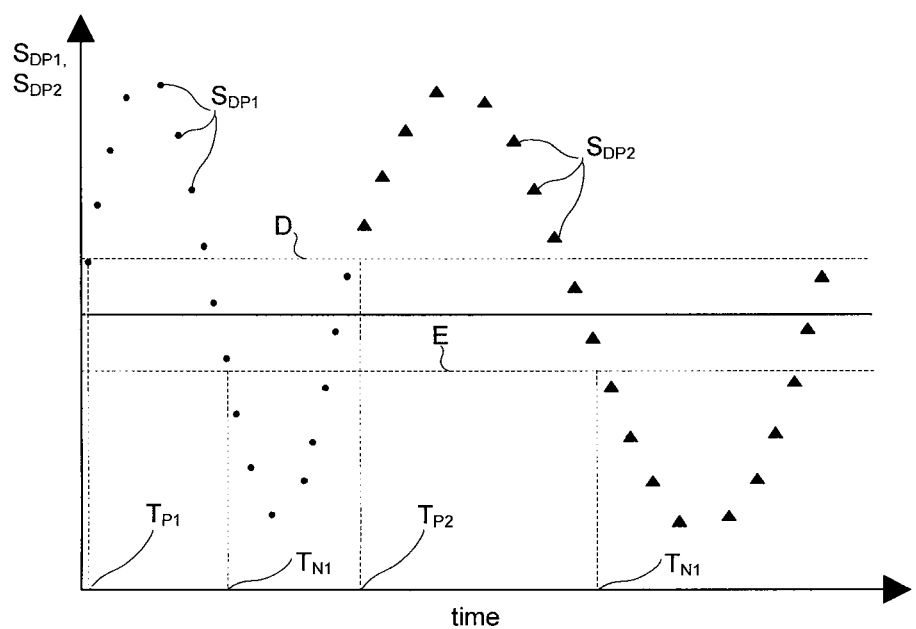
FIG. 4 shows a diagram of two first subdivided single periods $S_{DP1}$, $S_{DP2}$ including various number of samples.

Then the discrete processed signal $S_{DP}$ is split into subdivided single periods $S_{DP1}, S_{DP2}, \ldots, S_{DPn}$ between each of consecutive positive zero crossing time instants $T_{P1}, T_{P2}, \ldots T_{Pn}$. The length of each of the subdivided single periods $S_{DP1}, S_{DP2}, \ldots, S_{DPn}$ can vary in the time domain. FIG. 4 shows two first subdivided single periods $S_{DP1}$ and $S_{DP2}$ including various numbers of samples. Subdivided single period $S_{DP1}$ is marked by circles and next subdivided single period $S_{DP2}$ is marked by triangles.

Figure 5:
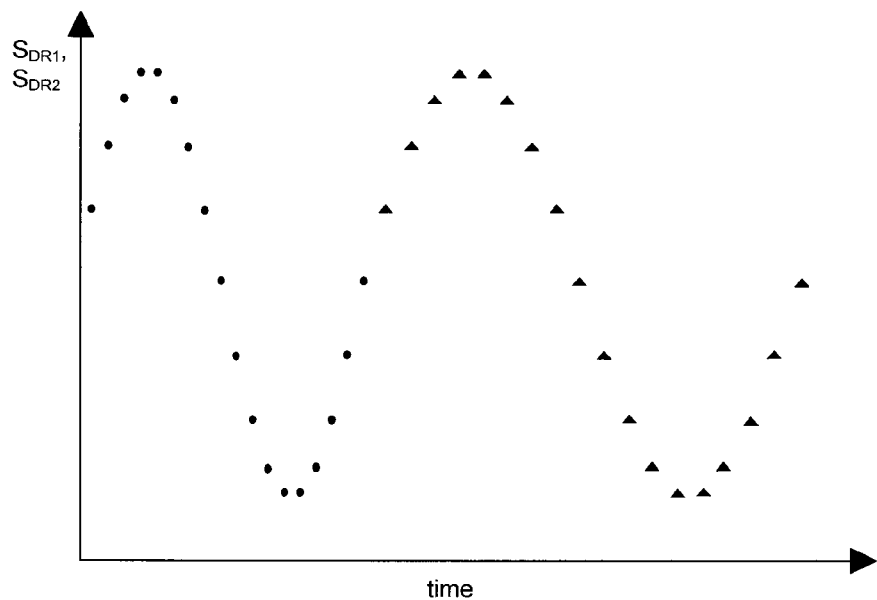
FIG. 5 shows a diagram of two first subdivided single periods after resampling $S_{DR1}$, $S_{DR2}$ including the same number of samples.

Next, each of subdivided single periods $S_{DP1}, S_{DP2}, \ldots, S_{DPn}$ is resampled using known resampling techniques such that the subdivided single periods after resampling $S_{DR1}, S_{DR2}, \ldots, S_{DRn}$ have the same number of samples as the number of samples in one period $N_{Fs}$ of a signal with constant frequency equal to the base supply frequency $F_l$. FIG. 5 shows two first subdivided single periods after resampling $S_{DR1}$ and $S_{DR2}$ including the same number of samples.

Figure 6:
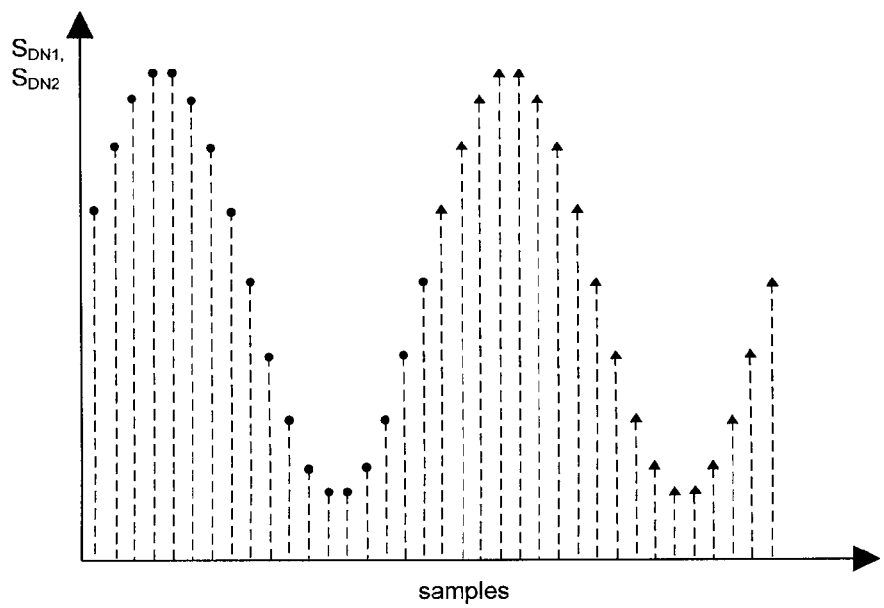
FIG. 6 shows a diagram of two first subdivided single periods after nondimensionalization $S_{DN1}$, $S_{DN2}$ including the same number of samples.

Next, replacing of the vector of time instants is executed. Each of the subdivided single periods after resampling $S_{DR1}, S_{DR2}, \ldots, S_{DRn}$ contains a vector of time instants and an associated vector of amplitudes. In the subdivided single period $S_{DR1}$ the vector of time instants is replaced by a vector of consecutive integer numbers and the result is a new nondimensional single period $S_{DN1}$ that contains the vector of consecutive integer numbers and the associated vector of amplitudes. This operation is repeated for each of the subdivided single periods after resampling $S_{DR2}, \ldots, S_{DRn}$ in same way as for $S_{DN1}$. FIG. 6 shows two first subdivided nondimensional single periods $S_{DN1}$ and $S_{DN2}$ including the same number of samples. Signal $S_{DN1}$ is described by circle markers and signal $S_{DN2}$ is described by triangle markers.

Figure 7:
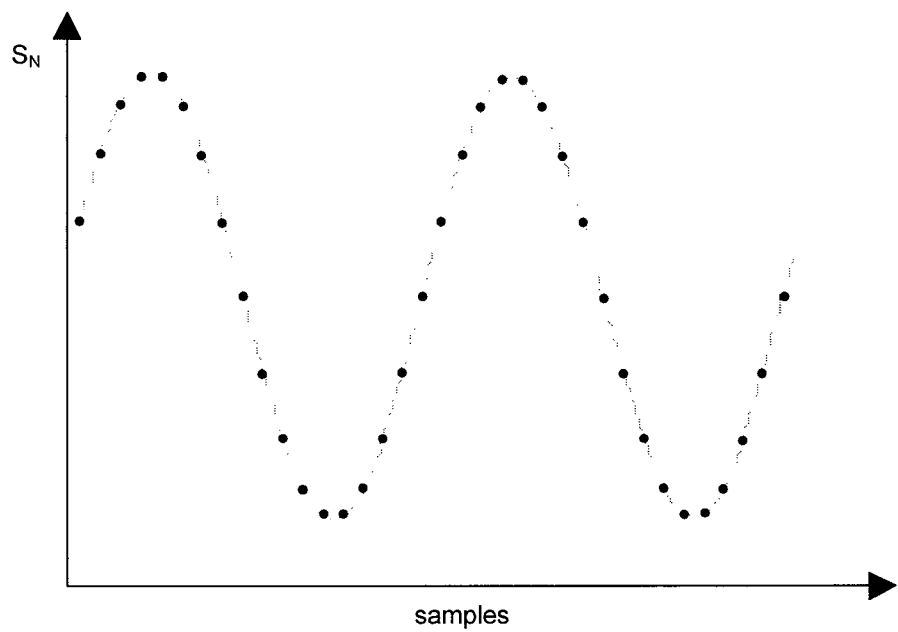
FIG. 7 shows a diagram of concatenated nondimensionalized discrete signal $S_N$.

Next, all subdivided nondimensional signals $S_{DN1}, S_{DN2}, \ldots, S_{DNn}$ are concatenated in the way that samples from consecutive subdivided nondimensional signals are taken in turn and set up one after another. The concatenation results in nondimensionalized discrete signal $S_N$ which contains a vector of integer numbers and an associated vector of amplitudes. The nondimensionalized signal $S_N$ is shown in FIG. 7.

Figure 8:
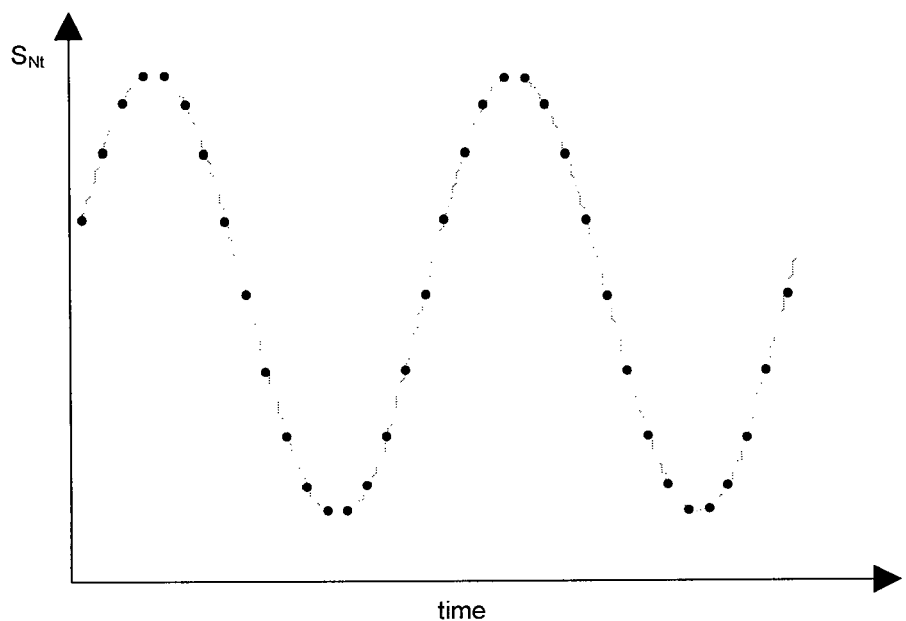
FIG. 8 shows a diagram of dimensionalized stationary discrete signal $S_{Nt}$.
Figure 9:
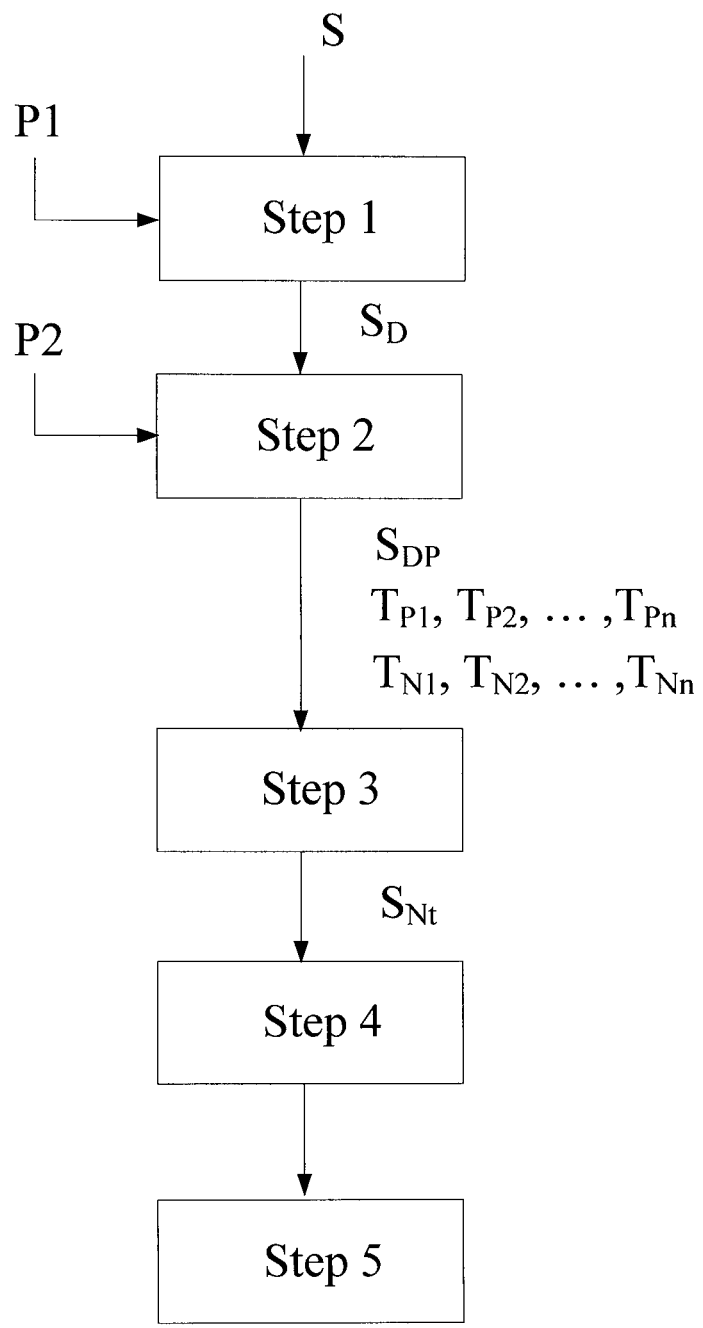
FIG. 9 shows a flow chart illustrating the method for the realization of the invention.

Next the consecutive elements of the vector of integer numbers are replaced with a vector of ascending time instants where the time period between each ascending time instant is equal to a the inverse of the sampling rate $F_S$. The result of this step is to create a dimensionalized stationary signal $S_{Nt}$ which contains a modified vector of time instants and an associated vector of amplitudes. The dimensionalized stationary signal $S_{Nt}$ is shown in FIG. 8.

All transformations described in the step S3 are realized in the nondimensionalization module 8 implementing in the computer device 6.

Step 4

Next the calculation of the DFT (Discrete Fourier Transform) of dimensionalized stationary signal $S_{Nt}$ is performed. The DFT operation transforms the signal from the time domain into a signal in the frequency domain allowing spectral analysis to be performed; the details of such calculation including algorithms used to compute the DFT, such as the Fast Fourier Transform, are well known to those skilled in the art.

The obtained DFT spectrum can be processed by any of known method for extracting a vector of interest frequencies and a corresponding vector of amplitudes.

The vector of interest frequencies and the corresponding vector of amplitudes are used to diagnose electromechanical system. In particular, the data from above vectors might be used for known motor current signature analysis—MCSA.

Step 5

In step 5, the results obtained in step 4 are visualized by means of the visualization device 9 using a known method.

| Nomenclature | |
| --- | --- |
| Letter | Name |
| S | analog waveform signal |
| P1 | constant parameters |
| $F_s$ | sampling rate |
| $T_L$ | length of the signal |
| $S_D$ | discrete signal |
| $a_1, \ldots a_i, \ldots a_k$ | samples of discrete signal $S_D$ |
| k | total number of samples in the discrete signal |
| $X_{mean}$ | arithmetic mean value of the discrete signal |
| $S_{DP}$ | discrete processed signal |
| $b_1, \ldots b_i, \ldots b_k$ | samples of discrete processed signal $S_{DP}$ |
| D | positive hysteresis parameter |
| E | negative hysteresis parameter |
| P2 | constant parameters |
| $T_P$ | positive zero crossing time |
| $T_N$ | negative zero crossing time |
| $T_{P1}, T_{P2}, \ldots T_{Pn}$ | sequences of consecutive positive zero crossing time instants |
| $T_{N1}, T_{N2}, \ldots T_{Nn}$ | sequences of consecutive negative zero crossing time instants |
| $T_{D1}, T_{D2}, \ldots T_{Dn}$ | sequence of time intervals |
| $T_{mean}$ | arithmetic mean value of the sequence of time intervals |
| $F_I$ | base supply frequency |
| $N_{Fs}$ | number of samples per one period of a signal with constant frequency equal to the base supply frequency |
| $S_{DP1}, S_{DP2}, \ldots, S_{DPn}$ | subdivided single periods of signal $S_{DP}$ |
| $S_{DR1}, S_{DR2}, \ldots, S_{DRn}$ | subdivided single periods after resampling |
| $S_{DN1}, S_{DN2}, \ldots, S_{DNn}$ | subdivided nondimensional single periods |
| $S_N$ | nondimensionalized discrete signal |
| $S_{Nt}$ | dimensionalized stationary signal |

What is claimed is:

1. A method of determining stationary signals for the diagnostics of an electromechanical system to prevent a false diagnosis of an electrical rotating machine that is part of the electromechanical system comprising the steps of:

supplying the electrical rotating machine with a variable speed frequency drive by supply cables;

coupling a measuring device to the supply cables connected to the electrical rotating machine;

providing said measuring device with an analog to digital converter connected to a processing device which includes a processing module and a nondimensionalization module;

measuring an analog waveform signal (S) generated by the electrical rotating machine with said measuring device, receiving the analog waveform signal in said analog to digital converter and converting the analog waveform signal (S) to a discrete processed signal ($S_{DP}$) including vector of time instants and corresponding vector of amplitudes with the analog to digital converter, receiving the discrete processed signal ($S_{DP}$) in said processing device, splitting the discrete processed signal ($S_{DP}$) into subdivided single periods ($S_{DP1}$, $S_{DP2}$, . . . , $S_{DPn}$) with the processing module where each of the subdivided single periods includes a different or the same number of samples as other subdivided single periods, modifying the number of samples for each subdivided single periods ($S_{DP1}$, $S_{DP2}$, . . . , $S_{DPn}$) by a resampling procedure getting subdivided single periods after resampling ($S_{DR1}$, $S_{DR2}$, . . . , $S_{DPn}$) in the nondimensionalization module, where all said subdivided single periods after resampling include the same number of samples, replacing the vector of time instants on a vector of consecutive integer numbers for each single period after resampling ($S_{DR1}$, $S_{DR2}$, . . . , $S_{DRn}$), obtaining subdivided nondimensional single periods ($S_{DN1}$, $S_{DN2}$, . . . , $S_{DNn}$) in the nondimensionalization module, concatenating all subdivided nondimensional single periods ($S_{DN1}$, $S_{DN2}$, . . . , $S_{DNn}$) into one nondimensional discrete signal ($S_N$) by forming a sequence of consecutive samples setting up one after another taken from consecutive subdivided nondimensional single periods in the nondimensionalization module, replacing the vector of consecutive integer numbers on a vector of ascending time instants in the nondimensional discrete signal ($S_N$), obtaining a dimensionalized stationary signal ($S_{Nt}$) in the nondimensionalization module, and transforming the dimensionalized stationary signal ($S_{Nt}$) from time domain to frequency domain, getting a frequencies spectrum, from which a vector of interest frequencies and corresponding vector of amplitudes are extracted by the processing device to diagnose the electromechanical system and displaying the vector of interest frequencies and corresponding vector of amplitudes on a visualization device connected to the processing device such that variations in an electrical supply frequency transmitted by said supply cables do not affect display of the vector of interest frequencies and the corresponding vector of amplitudes.

2. A method according to claim 1, wherein the measured analog waveform signal is a current signal.

3. A method according to claim 2, wherein the method to diagnose the electromechanical system is a Motor Current Signature Analysis.

4. A method according to claim 1, wherein the measured analog waveform signal is a voltage signal.

5. A method according to claim 1, wherein the measured analog waveform signal is a torque signal.

6. A method according to claim 1, wherein the measured analog waveform signal is an acceleration or a velocity or a movement of vibration.

* * * * *